(12) United States Patent
Chang

(10) Patent No.: US 7,173,271 B2
(45) Date of Patent: Feb. 6, 2007

(54) PHASE-CHANGE MEMORY DEVICE AND METHOD OF MANUFACTURING THE SAME

(75) Inventor: Heon Yong Chang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/000,471

(22) Filed: Nov. 30, 2004

(65) Prior Publication Data
US 2006/0006374 A1 Jan. 12, 2006

(30) Foreign Application Priority Data
Jun. 30, 2004 (KR) ............ 10-2004-0050072

(51) Int. Cl.
*H01L 47/00* (2006.01)
*H01L 23/52* (2006.01)
(52) U.S. Cl. ............ 257/2; 257/3; 257/773; 257/751; 257/296; 257/E29.17
(58) Field of Classification Search ........ 257/2–3, 257/773, 751, 296, E29.17
See application file for complete search history.

(56) References Cited

U.S. PATENT DOCUMENTS
2003/0047762 A1 * 3/2003 Lowrey ............ 257/276
2005/0130414 A1 * 6/2005 Choi et al. ............ 438/672

FOREIGN PATENT DOCUMENTS
KR 10-20040032955 4/2004

* cited by examiner

*Primary Examiner*—Kenneth Parker
*Assistant Examiner*—Joseph Nguyen
(74) *Attorney, Agent, or Firm*—Ladas & Parry LLP

(57) ABSTRACT

Disclosed are a phase-change memory device and its manufacturing method, which can reduce a contact area between a bottom electrode and a phase-change layer, thereby reducing the quantity of current necessary for phase change. The phase-change memory device comprises: a first oxide layer formed on a dielectric interlayer and a bottom electrode on a substrate and having a contact hole for exposing the bottom electrode formed in the first oxide layer; a spacer formed on a side surface of the contact hole; a phase-change layer formed on the spacer and the bottom electrode while forming a shape of another spacer; a second oxide layer filling in the contact hole while exposing an upper portion of the phase-change layer; and a top electrode formed on the first oxide layer while being in contact with the upper portion of the phase-change layer.

4 Claims, 5 Drawing Sheets

US 7,173,271 B2

PHASE-CHANGE MEMORY DEVICE AND METHOD OF MANUFACTURING THE SAME

BACKGROUND OF THE INVENTION

1. Field of the Invention

The present invention relates to a phase-change memory device and method of manufacturing the same, and more particularly to a phase-change memory device and method of manufacturing the same, which can reduce a contact area between a bottom electrode and a phase-change layer, thereby reducing quantity of current.

2. Description of the Prior Art

Recently, increasing attentions are paid to flash memory devices having a capability of keeping information stored therein even when power supplied thereto is interrupted. Usually, a flash memory includes a tunnel oxide layer, a floating gate, an inter-gate dielectric layer, and a control gate electrode, which are sequentially laminated on a channel. Therefore, in order to improve the reliability and program efficiency of the flash memory devices, it is necessary to improve the film quality of the tunnel oxide layer and increase a coupling rate of each cell.

Further, in place of the flash memory devices, new non-volatile memory devices have recently proposed. For example, a phase-change memory device stores information by using electric resistance difference according to the phase change. In such a phase-change memory device, a thin film made from chalcogenide alloy ($Ge_2Sb_2Te_5$) experiences a phase change from an amorphous state to a crystalline state, so that the resistance and activation energy of the chalcogenide layer decrease while both the long-range atomic order and free electron density increase. The phase-change memory device is advantageous in that the phase-change memory device can be easily fabricated as an SOC (System On Chip) and is relatively low priced. Further, the phase-change memory device has a very fast processing speed of 5 ns, consumes a reduced power, and has a wide operation temperature range of −196~180° C.

FIG. 1 is a graph for illustrating a method of programming and erasing a phase-change memory cell.

As shown in FIG. 1, if a phase-change layer is cooled after being heated at a temperature higher than the melting temperature Tm during a first operation time interval T1 (as shown by curve A), the phase-change layer comes into an amorphous state. In contrast, if the phase-change layer is cooled after being heated at a temperature lower than the melting temperature Tm and higher than the crystallization temperature Tc during a second operation time interval T2 longer than the first operation time interval T1 (as shown by curve B), the phase-change layer comes into a crystalline state. Here, the phase-change layer has a higher specific resistance in the amorphous state than in the crystalline state.

Therefore, whether the information stored in the phase-change memory cell refers to a logic '1' or '0' can be determined by detecting the current flowing through the phase-change layer in the 'read' mode. A compound material layer (hereinafter, referred to as "GST layer") consisting of germanium (Ge), stibium (Sb), and tellurium (Te) is widely used as the phase-change layer.

FIG. 2 is a sectional view of a conventional phase-change memory cell.

In the conventional phase-change memory cell as shown in FIG. 2, a dielectric interlayer 5 is formed on a bottom electrode 3 of a semiconductor substrate 1. Then, the dielectric interlayer 5 is etched to form a contact plug 7 electrically connected with source regions and a phase-change layer 9 is then formed on the resultant substrate having the contact plug 7 formed thereon. Thereafter, a top electrode 11 is formed on the phase-change layer 9.

When voltage is applied in order to program the phase-change memory cell, heat is generated at an interface between the phase-change layer 9 and the contact plug 7, so that a portion 9a of the phase-change layer 9 is transformed into an amorphous state. The heat generated at the periphery C of the contact plug 7 and the phase-change layer 9 may be spread to the neighboring contact plug 7 and be unable to reach the temperature necessary for the phase change. Therefore, even after the phase-change layer is phase-changed into an amorphous state, there may remain an abnormal region (which is not changed into the amorphous state) at the periphery of the phase-change layer 9.

Further, in the 'read' and 'write' operations of the phase-change memory device, the large contact area between the bottom electrode and the phase-change layer requires an increased quantity of current for the phase change, thereby having a bad influence on the speed of the phase-change memory device.

SUMMARY OF THE INVENTION

Accordingly, the present invention has been made to solve the above-mentioned problems occurring in the prior art, and an object of the present invention is to provide a phase-change memory device and method of manufacturing the same, which can reduce a contact area between a bottom electrode and a phase-change layer, thereby reducing the quantity of current necessary for phase change.

In order to accomplish this object, there is provided a phase-change memory device comprising: a semiconductor substrate having a bottom structure; a dielectric interlayer formed on the semiconductor substrate and covering the bottom structure; a contact plug formed within the dielectric interlayer; a bottom electrode formed on the contact plug and a portion of the dielectric interlayer adjacent to the contact plug; a first oxide layer formed on the dielectric interlayer and the bottom electrode and having a contact hole for exposing the bottom electrode formed within the first oxide layer; a spacer formed on a side surface of the contact hole; a phase-change layer formed on the spacer and the bottom electrode while forming a shape of another spacer; a second oxide layer filling in the contact hole while exposing an upper portion of the phase-change layer; and a top electrode formed on the first oxide layer while being in contact with the upper portion of the phase-change layer.

It is preferred that the phase-change layer has a doughnut shape in a plan view.

It is also preferred that each of the bottom electrode and the top electrode is formed of a polysilicon film or a metal film.

It is also preferred that the spacer is formed of a nitride film.

It is also preferred that the first oxide film is formed of one selected from the group consisting of HDP, USG, SOG, BPSG, PSG, TEOS and HLD.

In accordance with another aspect of the present invention, there is provided a method of manufacturing a phase-change memory device, comprising the steps of: providing a semiconductor substrate having a bottom structure; forming a dielectric interlayer on the semiconductor substrate to cover the bottom structure; forming a contact plug within the dielectric interlayer; forming a bottom electrode on the contact plug and a portion of the dielectric interlayer adjacent to the contact plug; forming a first oxide layer on the dielectric interlayer and the bottom electrode; etching the first oxide layer to form a contact hole for exposing the bottom electrode; forming a spacer on a side surface of the contact hole; forming a phase-change layer on the spacer and the bottom electrode, the phase-change layer having a shape of another spacer; depositing a second oxide layer on the first oxide layer to fill in the contact hole; etching the second oxide layer to expose an upper portion of the phase-change layer; and forming a top electrode on the first oxide layer such that the top electrode is in contact with the phase-change layer.

It is preferred that a surface of the first oxide layer is flattened by a CMP process after the first oxide layer is formed.

It is also preferred that the phase-change layer has a doughnut shape in a plan view.

It is also preferred that each of the bottom electrode and the top electrode is formed of a polysilicon film or a metal film.

It is also preferred that the spacer is formed of a nitride film.

It is also preferred that the first oxide film is formed of one selected from the group consisting of HDP, USG, SOG, BPSG, PSG, TEOS and HLD.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
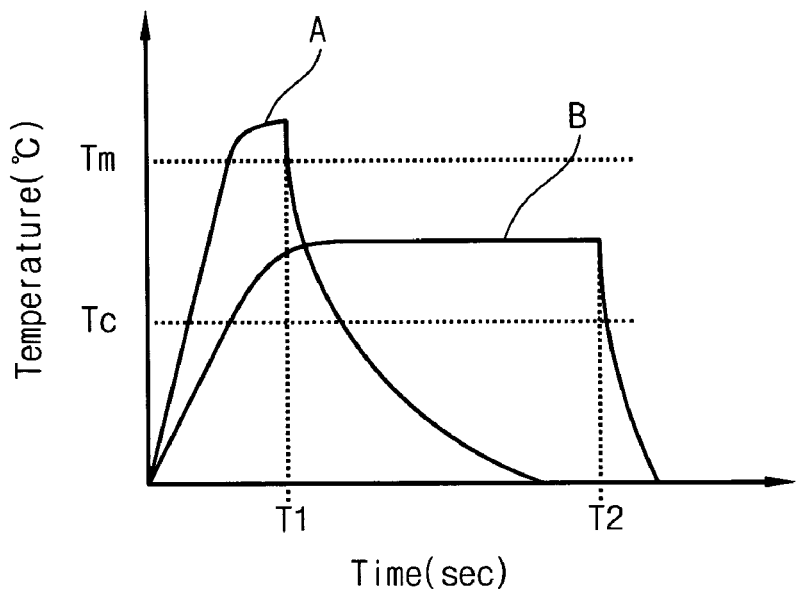
FIG. 1 is a graph for illustrating a method of programming and erasing a phase-change memory cell.
Figure 2:
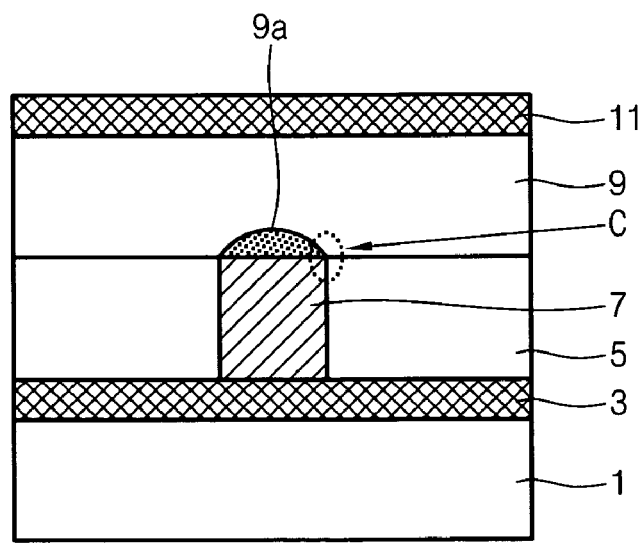
FIG. 2 is a sectional view of a conventional phase-change memory cell.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
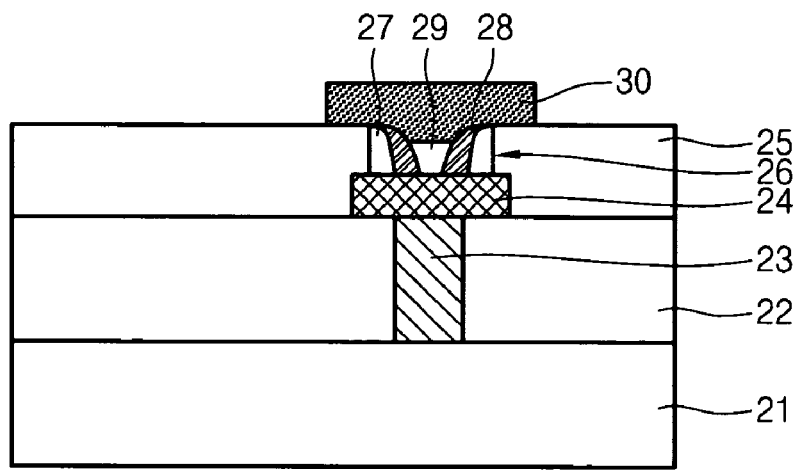
FIG. 3 is a sectional view of a phase-change memory device according to an embodiment of the present invention.

FIG. 3 is a sectional view of a phase-change memory device according to an embodiment of the present invention.

Referring to FIG. 3, in the phase-change memory device according to the present invention, a dielectric interlayer 22 is formed to cover a bottom structure (not shown) of a semiconductor substrate 21 and a contact plug 23 is then formed within the dielectric interlayer 22. Then, a bottom electrode 24 is formed on the contact plug 23 and a portion of the dielectric interlayer 22 adjacent to the contact plug 23. Then, a first oxide layer 25 is formed on the dielectric interlayer 22 and the bottom electrode 24, and a contact hole 26 for exposing the bottom electrode 24 is formed in the first oxide layer 25. A spacer 27 is formed on a side surface of the contact hole 26 and a phase-change layer 28 in a shape of a spacer is formed on the spacer 27 and the bottom electrode 24. A second oxide layer 29 is formed inside of the spacer within the contact hole 26 such that an upper portion of the phase-change layer 28 is exposed. A top electrode 30 is formed on the first oxide layer 25 while being in contact with the phase-change layer 28.

The phase-change layer 28 has a doughnut shape in a plan view. It is preferred that each of the bottom electrode 24 and the top electrode 30 is formed of a polysilicon film or a metal film. It is also preferred that the spacer is formed of a nitride film. It is also preferred that the first oxide film 25 is formed of one selected from the group consisting of HDP, USG, SOG, BPSG, PSG, TEOS and HLD.

In a 'read' or 'write' operation of the phase-change memory device, when heat is generated at a contact surface of the phase-change layer 28, the state of the phase-change layer 28 changes into an amorphous state or a crystalline state. In the phase-change memory device according to the present invention, since the phase-change layer 28 is formed in a shape of a spacer on the bottom electrode 24 and the spacer 27, the contact area between the bottom electrode 24 and the phase-change layer 28 can be reduced. As a result, electric current necessary for phase change can be reduced and the speed of the phase-change memory device can be improved.

FIGS. 4A through 4E are sectional views showing a process of manufacturing a phase-change memory device according to an embodiment of the present invention.

Figure 4A:
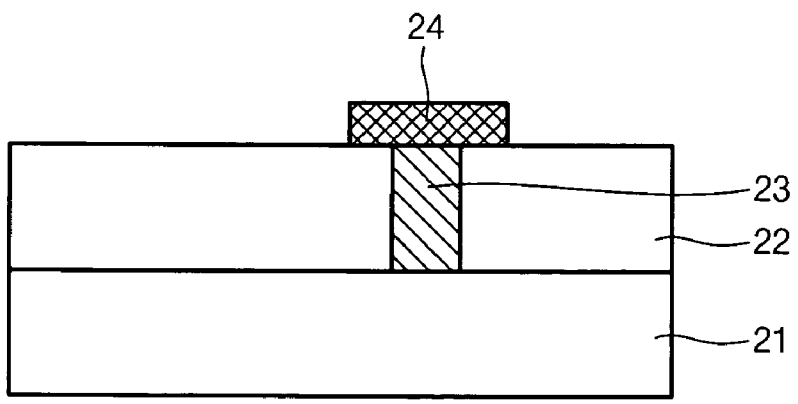
FIGS. 4A through 4E are sectional views showing a process of manufacturing a phase-change memory device according to an embodiment of the present invention.

As shown in FIG. 4A, the dielectric interlayer 22 is formed on the semiconductor substrate 21 having a bottom structure (not shown) to cover the bottom structure. Then, the contact plug 23 is formed within the dielectric interlayer 22. Thereafter, the bottom electrode 24 is formed on the contact plug 23 and a portion of the dielectric interlayer 22 adjacent to the contact plug 23. Here, the bottom electrode 24 is formed of a polysilicon film or a metal film.

Figure 4B:
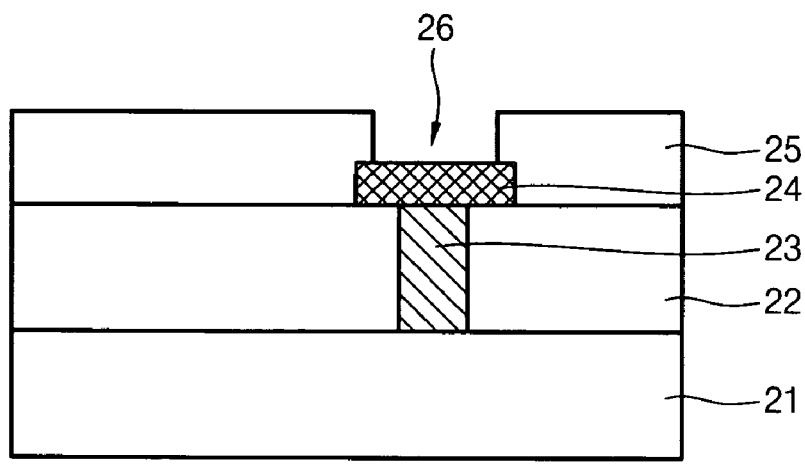

Referring to FIG. 4B, the first oxide layer 25 is formed on the dielectric interlayer 22 and the bottom electrode 24. Here, the first oxide layer 25 is formed of one selected from the group consisting of HDP, USG, SOG, BPSG, PSG, TEOS and HLD. Thereafter, the surface of the first oxide layer 25 is flattened through a CMP process so that the first oxide layer 25 has a uniform thickness. Thereafter, the contact hole 26 for exposing the bottom electrode 24 is formed in the first oxide layer 25 by etching the first oxide layer 25.

Figure 4C:
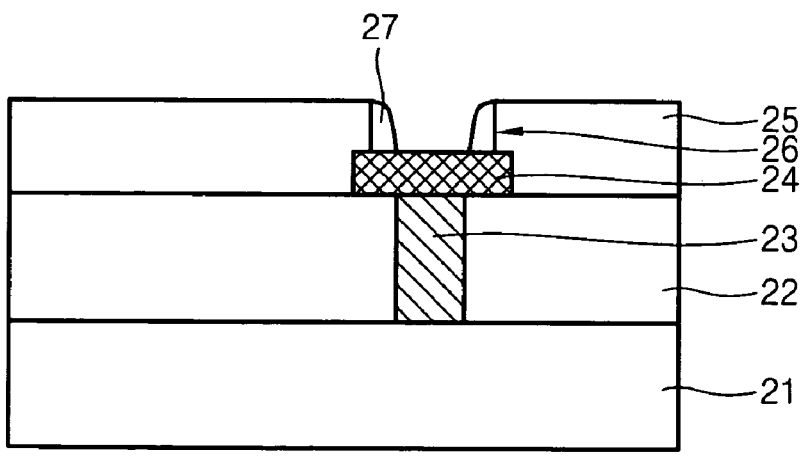

Referring to FIG. 4C, a nitride film is deposited on the resultant lamination including the exposed bottom electrode 24 and the first oxide layer 25 on the substrate 21. Then, the nitride layer is subjected to anisotropic etching so as to form a spacer 27 on a side surface of the contact hole 26.

Figure 4D:
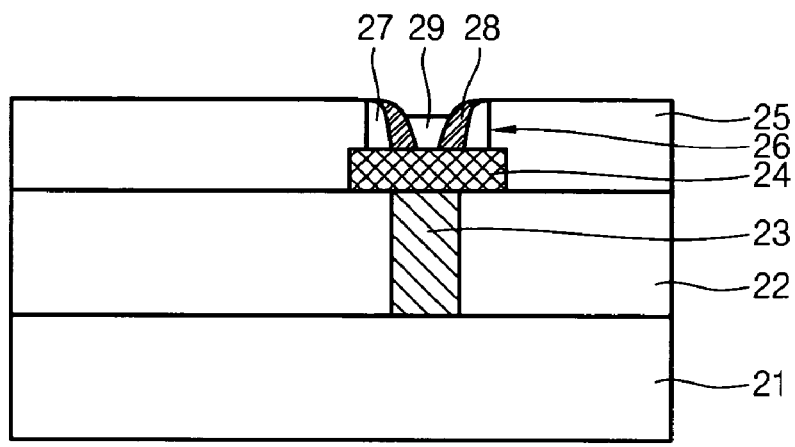
Figure 5:
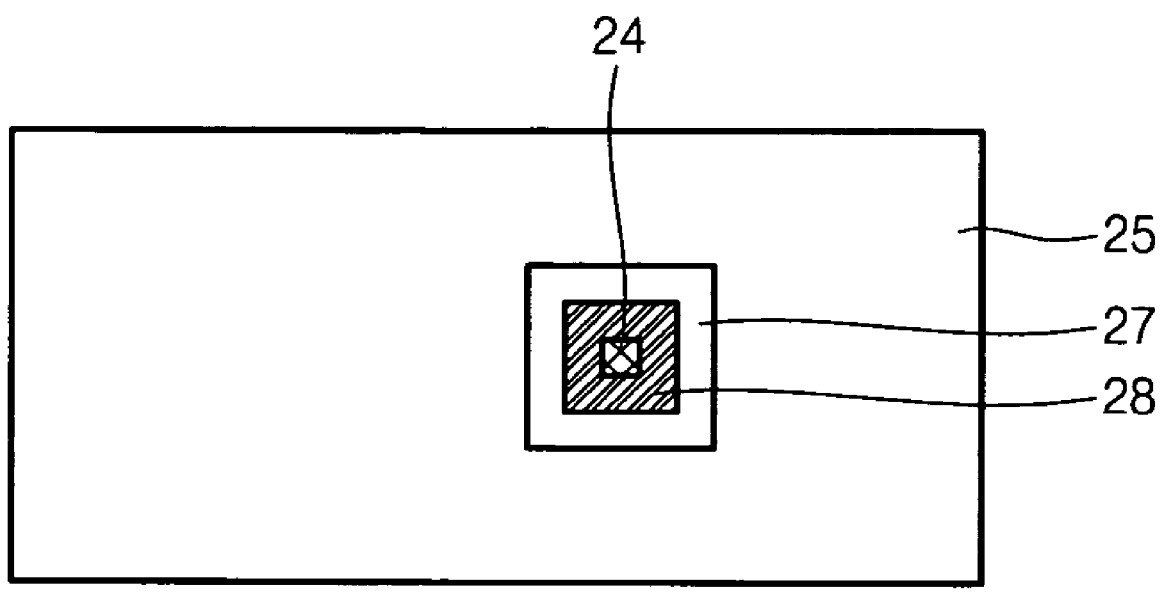
FIG. 5 is a plan view of a phase-change memory device according to an embodiment of the present invention.

Referring to FIG. 4D, the phase-change layer 28 is formed on the resultant lamination including the bottom electrode 24, the spacer 27 and the first oxide layer 25. Then, the phase-change layer 28 is subjected to anisotropic etching so as to remain in a shape of another spacer on the spacer 27 and the bottom electrode 24. Here, as shown in FIG. 5, the phase-change layer 28 has a doughnut shape between the spacer 27 and the bottom electrode 24 in a plan view.

Next, the second oxide layer 29 is deposited on the first oxide layer 25 to fill in the contact hole 26. Then, the second oxide layer 29 is etched to expose the upper end of the phase-change layer 28.

Figure 4E:
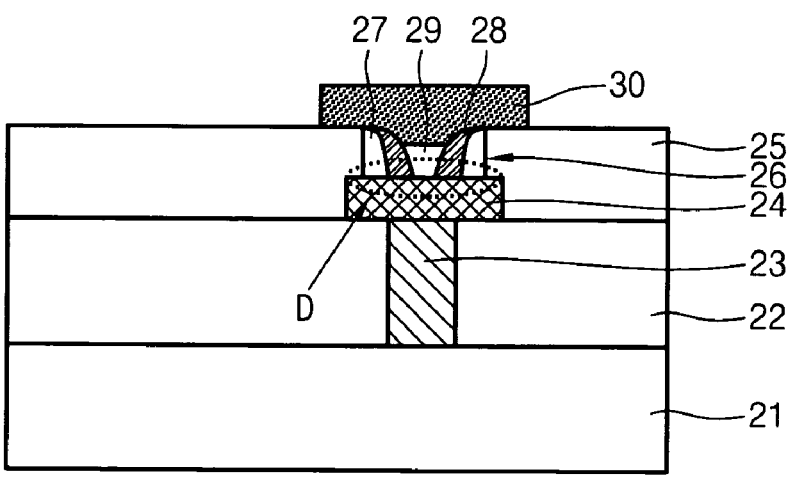

Next, as shown in FIG. 4E, the top electrode 30 is formed on the first oxide layer 25 such that the top electrode 30 is in contact with the phase-change layer 28. Herein, the top electrode 30 is formed of a polysilicon film or a metal film.

As described above, a contact hole of a predetermined size is formed in an oxide layer, a spacer is formed on a side surface of the contact hole, and a phase-change layer is formed on the space and the bottom electrode, so that the contact area between the bottom electrode and the phase-change layer is reduced.

According to the present invention as described above, in order to facilitate the phase change, a contact hole of a predetermined size is formed in an oxide layer, a spacer is formed on a side surface of the contact hole, and a phase-change layer is formed on the space and the bottom electrode. As a result, the contact area between the bottom electrode and the phase-change layer is reduced, so that electric current necessary for the phase change can be reduced.

Also, such reduction of the electric current necessary for the phase change can consequently improve speed of the phase-change memory device.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A phase-change memory device comprising:
   a semiconductor substrate having a bottom structure;
   a dielectric interlayer formed on the semiconductor substrate and covering the bottom structure;
   a contact plug formed within the dielectric interlayer;
   a bottom electrode formed on the contact plug and a portion of the dielectric interlayer adjacent to the contact plug;
   a first oxide layer formed on the dielectric interlayer and the bottom electrode and having a contact hole for exposing the bottom electrode formed within the first oxide layer;
   a spacer formed on a side surface of the contact hole and on a first annular-shaped area of the bottom electrode:
   a phase-change layer formed on the spacer and on a second annular shaped area on the bottom electrode that is within the first annular shaped area, said phase-change layer having substantially the same cross-sectional shape of said spacer, said phase-change layer being sized, shaped and arranged to appear to have a doughnut-shape when viewed from a plan view of said phase-change layer, the bottom of said phase-change lever contacting the bottom electrode through said second annular contact area, the top of said phase-change layer contacting a top electrode through an upper contact area of the phase-change layer that is away from the bottom of said phase-change layer;
   a second oxide layer filling in the contact hole while exposing an upper portion of the phase-change layer; and
   said top electrode formed on the first oxide layer while being in contact with the upper portion of the phase-change layer.

2. The phase-change memory device as claimed in claim 1, wherein each of the bottom electrode and the top electrode is formed of a polysilicon film or a metal film.

3. The phase-change memory device as claimed in claim 1, wherein the spacer is formed of a nitride film.

4. The phase-change memory device as claimed in claim 1, wherein the first oxide film is formed of one selected from the group consisting of HDP, USG, SOG, BPSG, PSG, TEOS and HLD.

* * * * *